(12) United States Patent
Lin (10) Patent No.: US 9,379,099 B2
(45) Date of Patent: Jun. 28, 2016

(54) ESD PROTECTION CIRCUIT AND INTEGRATED CIRCUIT

(71) Applicant: National Taiwan Normal University, Taipei (TW)

(72) Inventor: Chun-Yu Lin, Hsinchu (TW)

(73) Assignee: NATIONAL TAIWAN NORMAL UNIVERSITY, Taipei (TW)

( * ) Notice: Subject to any disclaimer, the term of this patent is extended or adjusted under 35 U.S.C. 154(b) by 0 days.

(21) Appl. No.: 14/452,961

(22) Filed: Aug. 6, 2014

(65) Prior Publication Data

US 2015/0325569 A1 Nov. 12, 2015

(30) Foreign Application Priority Data

May 12, 2014 (TW) .............................. 103116734 A (51) Int. Cl.
*H01L 27/02* (2006.01)

(52) U.S. Cl.
CPC ........ *H01L 27/0262* (2013.01); *H01L 27/0248* (2013.01)

(58) Field of Classification Search
CPC .................. H01L 27/0262; H01L 27/0248
See application file for complete search history.

(56) References Cited

U.S. PATENT DOCUMENTS

| 5,546,038 | A | 8/1996 | Croft |
| 6,885,534 | B2 | 4/2005 | Ker et al. |
| 8,952,456 | B2 * | 2/2015 | Ker et al. ............... 257/355 |
| 2011/0207409 | A1 | 8/2011 | Ker et al. |

FOREIGN PATENT DOCUMENTS

CN 102163840 A 8/2011

* cited by examiner

*Primary Examiner* — Long Pham
(74) *Attorney, Agent, or Firm* — Muncy, Geissler, Olds & Lowe, P.C.

(57) ABSTRACT

An ESD protection circuit is cooperated with a high-frequency circuit and includes a silicon-controlled rectifier element and an inductive element. The silicon-controlled rectifier element is formed by the sequential connection of a first P-type semiconductor material, a first N-type semiconductor material, a second P-type semiconductor material and a second N-type semiconductor material. The silicon-controlled rectifier element has a first end and a second end, and the first end is electrically coupled with the first P-type semiconductor material while the second end is electrically coupled with the second N-type semiconductor material. One end of the inductive element is electrically coupled with the first end and the other end thereof is electrically coupled with the first N-type semiconductor material, or one end of the inductive element is electrically coupled with the second end and the other end thereof is electrically coupled with the second P-type semiconductor material.

8 Claims, 7 Drawing Sheets

ESD PROTECTION CIRCUIT AND
INTEGRATED CIRCUIT

CROSS REFERENCE TO RELATED
APPLICATIONS

This Non-provisional application claims priority under 35 U.S.C. §119(a) on Patent Application No(s). 103116734 filed in Taiwan, Republic of China on May 12, 2014, the entire contents of which are hereby incorporated by reference.

BACKGROUND OF THE INVENTION

1. Field of Invention

The invention relates to an electrostatic discharge (ESD) protection circuit and an integrated circuit.

2. Related Art

Electrostatic discharge (ESD) issue is a key factor to cause the damage to the most electronic elements or systems. ESD is usually formed by the human cause and also difficult to be avoided. For example, the static electricity will be accumulated in the human body, appliances, storage devices and even electronic elements in the manufacturing, production, assembly, testing, storage and conveying process of the electronic element or system. The workers may unknowingly make these objects contact each other and an ESD path is thus formed. Therefore, the electronic element or system will be damaged by the ESD. This kind of damage may result in the permanent harm for the semiconductor device or computer system and the electronic product or system thus malfunctions. Therefore, in order to assure the efficiency of the electronic circuit, especially of the IC chip, the ESD protection circuit is indispensible.

According to the principle of the transistor, when the size of the transistor is smaller, a higher operation frequency can be obtained. Hence, since the device manufacturing has reached nanoscale, the operation frequency of the transistor is favorably increased due to the rapid development of the scaled down technology. However, for the scaled-down transistor, ESD is the main factor influencing the reliability thereof. Therefore, a proper ESD protection circuit needs to be designed to prevent the circuit device from being damaged by the ESD. Especially in the application of the high-frequency integrated circuit, with the operation frequency from several GHz to dozens of GHz and even to hundreds of GHz for example, the ESD protection circuit not only needs a sufficiently high ESD immunity but also a very low parasitic capacitance, or the loading caused by the parasitic capacitance will result in the performance reduction of the circuit.

SUMMARY OF THE INVENTION

An objective of the invention is to provide an ESD protection circuit and an integrated circuit. The ESD protection circuit disclosed in the invention has not only a really good ESD protection capability but also a very low parasitic capacitance and won't cause the performance reduction of the integrated circuit.

To achieve the above objective, an ESD protection circuit according to the invention is cooperated with a high-frequency circuit and includes a silicon-controlled rectifier element and an inductive element. The silicon-controlled rectifier element is formed by the sequential connection of a first P-type semiconductor material, a first N-type semiconductor material, a second P-type semiconductor material and a second N-type semiconductor material. The silicon-controlled rectifier element has a first end and a second end, and the first end is electrically coupled with the first P-type semiconductor material while the second end is electrically coupled with the second N-type semiconductor material. One end of the inductive element is electrically coupled with the first end and the other end thereof is electrically coupled with the first N-type semiconductor material, or one end of the inductive element is electrically coupled with the second end and the other end thereof is electrically coupled with the second P-type semiconductor material.

To achieve the above objective, an integrated circuit according to the invention comprises an inner circuit and an ESD protection circuit. The ESD protection circuit is electrically coupled with the inner circuit and includes a silicon-controlled rectifier element and an inductive element. The silicon-controlled rectifier element is formed by the sequential connection of a first P-type semiconductor material, a first N-type semiconductor material, a second P-type semiconductor material and a second N-type semiconductor material, and has a first end electrically coupled with the first P-type semiconductor material and a second end electrically coupled with the second N-type semiconductor material. One end of the inductive element is electrically coupled with the first end and the other end of the inductive element is electrically coupled with the first N-type semiconductor material, or one end of the inductive element is electrically coupled with the second end and the other end of the inductive element is electrically coupled with the second P-type semiconductor material.

In one embodiment, the ESD protection circuit further includes a trigger unit, one end of the trigger unit is electrically coupled to the first N-type semiconductor material and the other end of the trigger unit is electrically coupled to the second P-type semiconductor material.

In one embodiment, the ESD protection circuit further has a resonant frequency, the high-frequency circuit has an operation frequency, and the resonant frequency is equal to the operation frequency.

In one embodiment, the resonant frequency is equal to $1/2\pi(LC)^{1/2}$, L represents the inductance value of the inductor element, and C represents the parasitic capacitance between the first P-type semiconductor material and the first N-type semiconductor material or between the second P-type semiconductor material and the second N-type semiconductor material.

In one embodiment, the high-frequency circuit has at least a signal input end or at least a signal output end, and the first end is electrically coupled to the signal input end or the signal output end.

As mentioned above, in the ESD protection circuit and the integrated circuit of the invention, the ESD protection circuit includes a silicon-controlled rectifier element and an inductive element. The silicon-controlled rectifier element is formed by the sequential connection of a first P-type semiconductor material, a first N-type semiconductor material, a second P-type semiconductor material and a second N-type semiconductor material. One end of the inductive element can be electrically coupled with the first end of the silicon-controlled rectifier element and the other end thereof is electrically coupled with the first N-type semiconductor material, or one end of the inductive element is electrically coupled with the second end of the silicon-controlled rectifier element and the other end thereof is electrically coupled with the second P-type semiconductor material. Thereby, the parasitic capacitance of the silicon-controlled rectifier element can be counteracted by the inductive element, so that the ESD protection circuit of the invention has not only very good ESD protection capability but also very low parasitic capacitance and also won't cause the performance reduction of the integrated circuit.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
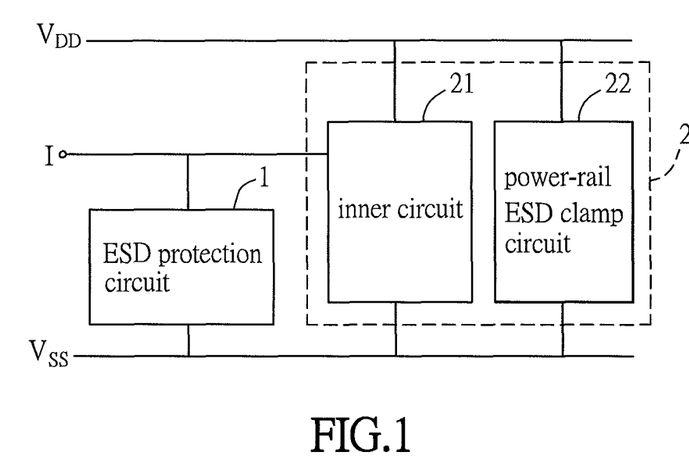
FIG. 1 is a schematic diagram of an ESD protection circuit cooperated with a high-frequency circuit according to a preferred embodiment of the invention.

FIG. 1 is a schematic diagram of an ESD protection circuit 1 cooperated with a high-frequency circuit 2 according to a preferred embodiment of the invention.

As shown in FIG. 1, the high-frequency circuit 2 is electrically coupled to a first voltage $V_{DD}$ and a second voltage $V_{SS}$, and the ESD protection circuit 1 acts as the ESD protection circuit of the high-frequency circuit 2. The first voltage $V_{DD}$ can be a positive voltage and the second voltage $V_{SS}$ can be zero (i.e. grounded), for example, and the voltage difference between the first voltage $V_{DD}$ and the second voltage $V_{SS}$ is the operation frequency of the high-frequency circuit 2. The high-frequency circuit 2 has at least a signal input end I or at least a signal output end, and the ESD protection circuit 1 is electrically coupled with the signal input end I or the signal output end. In this embodiment, just a single signal input end I is shown, and an ESD protection circuit 1 is electrically coupled with the signal input end I of the high-frequency circuit 2 and the second voltage $V_{SS}$ in a parallel connection. However, in a practical application, every signal input end I or every signal output end of the high-frequency circuit 2 can be electrically coupled to an ESD protection circuit 1, so as to provide the complete protection to the power line path against the ESD. Besides, the high-frequency circuit 2 includes an inner circuit 21 and a power-rail ESD clamp circuit 22. The inner circuit 21 is electrically coupled with the power-rail ESD clamp circuit 22 in a parallel connection, so that the complete ESD protection design can be accomplished by the ESD protection circuit 1 and the power-rail ESD clamp circuit 22.

Figure 2A:
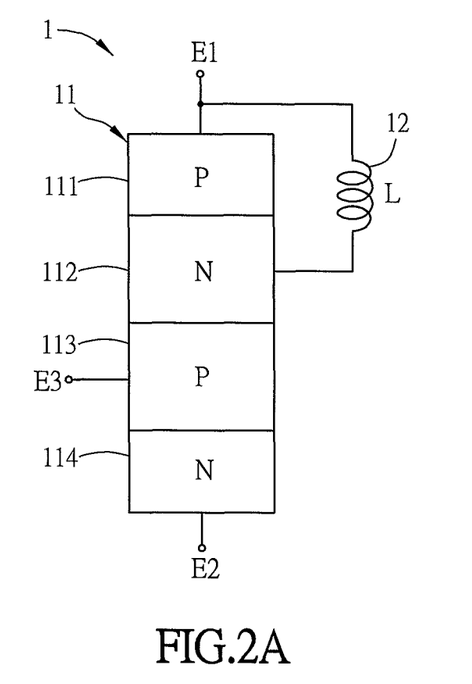
FIG. 2A is a schematic diagram of the ESD protection circuit according to a preferred embodiment of the invention.
Figure 2B:
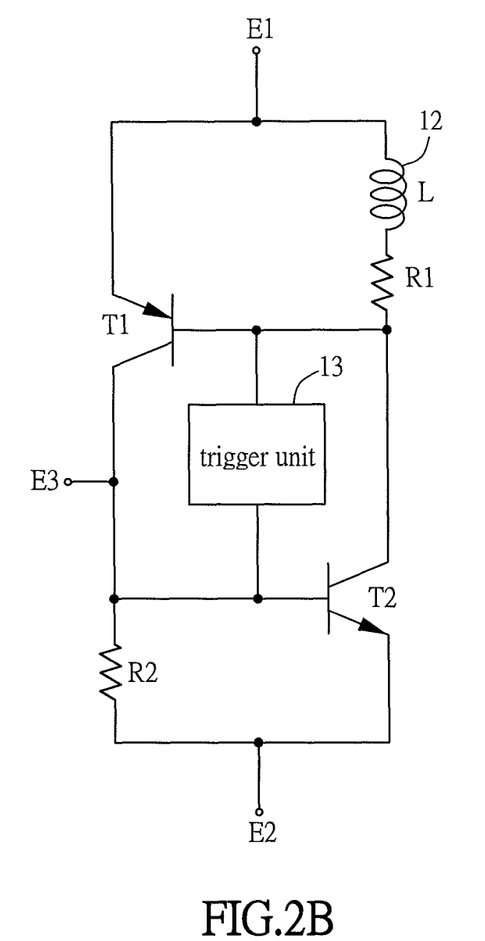
FIG. 2B is a schematic diagram of an equivalent circuit of the ESD protection circuit in FIG. 2A.
Figure 2C:
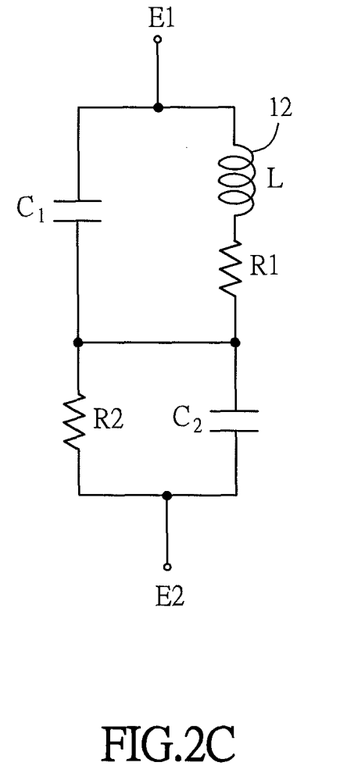
FIG. 2C is a schematic diagram of a simplified equivalent circuit of the circuit of FIG. 2B.

FIG. 2A is a schematic diagram of the ESD protection circuit 1 according to a preferred embodiment of the invention, FIG. 2B is a schematic diagram of an equivalent circuit of the ESD protection circuit 1 in FIG. 2A, and FIG. 2C is a schematic diagram of a simplified equivalent circuit of the circuit of FIG. 2B. The trigger unit 13 in FIG. 2B is not shown in FIGS. 2A and 2C.

As shown in FIG. 2A, the ESD protection circuit 1 includes a silicon-controlled rectifier element (commonly called a silicon-controlled rectifier, SCR) 11. The silicon-controlled rectifier element 11 is formed by the sequential connection of a first P-type semiconductor material 111, a first N-type semiconductor material 112, a second P-type semiconductor material 113 and a second N-type semiconductor material 114. Since the P-type and N-type semiconductor materials belong to the conventional art, their descriptions are omitted here for conciseness. The silicon-controlled rectifier (SCR) element 11 is a three-terminal thyristor element and includes a first end E1, a second end E2 and a third end E3. The first end E1 is the anode of the silicon-controlled rectifier element 11, the second end E2 is the cathode of the silicon-controlled rectifier element 11, and the third end E3 is the gate of the silicon-controlled rectifier element 11. The first end E1 is electrically coupled with the first P-type semiconductor material 111 and the signal input end I of the high-frequency circuit 2. The second end E2 is electrically coupled with the second N-type semiconductor material 114 and the second voltage $V_{SS}$. The third end E3 is electrically coupled with the second P-type semiconductor material 113.

Since the silicon-controlled rectifier element 11 is a four-layer semiconductor structure, the latchup issue will be generated by this four-layer semiconductor structure. However, in the ESD protection capability, the silicon-controlled rectifier element 11 is really good and can provide very high ESD immunity in a very small layout area. Besides, when the operation voltage of the integrated circuit is reduced more by the advanced process, the risk of the latchup issue brought by the silicon-controlled rectifier element 11 is reduced. Therefore, the silicon-controlled rectifier element 11 is used to serve as the component of the ESD protection circuit of the high-frequency circuit 2 in this invention. However, in order to reduce the parasitic effect of the silicon-controlled rectifier element 11, the ESD protection circuit 1 further includes an inductive element (commonly called an inductor with the inductance value L) 12, and the inductive element 12 is embedded into the silicon-controlled rectifier element 11, thereby reducing the parasitic capacitance of the silicon-controlled rectifier element 11. In this embodiment, one end of the inductive element 12 is electrically coupled with the first end E1 and the other end thereof is electrically coupled with the first N-type semiconductor material 112.

As shown in FIG. 2B, the equivalent circuit of the silicon-controlled rectifier element 11 includes two transistors T1 and T2. The transistor T1 is a PNP BJT transistor and the transistor T2 is an NPN BJT transistor. The emitter of the transistor T1 is coupled to the first end E1 (the first end E1 coupled to the signal input end I) and one end of the inductive element 12. The base of the transistor T1 is coupled to the collector of the transistor T2 and coupled to the other end of the inductive element 12 through a resistance R1 (the parasitic resistance of the transistor T1). The collector of the transistor T1 is coupled to the base of the transistor T2 and the third end E3 and coupled to the second end E2 through a resistance R2 (the parasitic resistance of the transistor T2). Besides, the emitter of the transistor T2 is coupled to the second end E2 (the second end E2 coupled to the second voltage $V_{SS}$).

The silicon-controlled rectifier element 11 needs to work with an effective trigger design in a practical application due to its higher trigger voltage and lower turn-on rate. In order that the silicon-controlled rectifier element 11 can be rapidly turned on when the ESD occurs, the substrate-trigger technology can be used to reduce the trigger voltage of the silicon-controlled rectifier element 11. Therefore, the ESD protection circuit 1 of this embodiment can further include a trigger unit 13, and one end of the trigger unit 13 is electrically coupled to the first N-type semiconductor material 112 while the other end thereof is electrically coupled to the second P-type semiconductor material 113. Herein, the trigger unit 13 is electrically coupled to and between the base of the transistor T1 and the base of the transistor T2. The trigger unit 13 can emit a trigger signal (may be a pulse wave) for example, and the trigger signal can provide sufficiently high current to rapidly turn on the transistors T1, T2, and thereby the silicon-controlled rectifier element 11 can rapidly discharge the static electricity when the ESD occurs.

As shown in FIG. 2C, $C_1$ represents the parasitic capacitance between the first P-type semiconductor material 111 and the first N-type semiconductor material 112, i.e. the parasitic capacitance between the base and emitter of the transistor T1, and $C_2$ represents the all parasitic capacitance of the other portion. In order to reduce the parasitic capacitance of the silicon-controlled rectifier element 11, the inductive element 12 is embedded into the silicon-controlled rectifier element 11 in this invention, wherein $f_0$ represents the resonant frequency of the inductance L and capacitance $C_1$, and the equation is given as below:

$$f_0 = 1/2\pi\sqrt{LC_1} \quad \text{(equation 1)}$$

Since the equivalent impedance of the parallel connection between $C_1$ and the series connection of L and R1 at the resonant frequency $f_0$ is infinity, the influence of the resistance R2 and parasitic capacitance ($C_2$) of the other portion can be disregarded. So, the signal loss of the ESD protection circuit 1 will be nearly zero at the resonant frequency $f_0$.

Accordingly, when this design is applied, the silicon-controlled rectifier element 11 having needs to be chosen with a sufficient capacity according to the required ESD immunity capability. Then, a proper inductive element 12 is chosen according to the equation 1, so that the resonant frequency $f_0$ is designed at the operation frequency of the high-frequency circuit 2 (that means the resonant frequency $f_0$ is equal to the operation frequency of the inner circuit 21). Thus, the ESD protection design of the high-frequency circuit 2 is finished.

Figure 3:
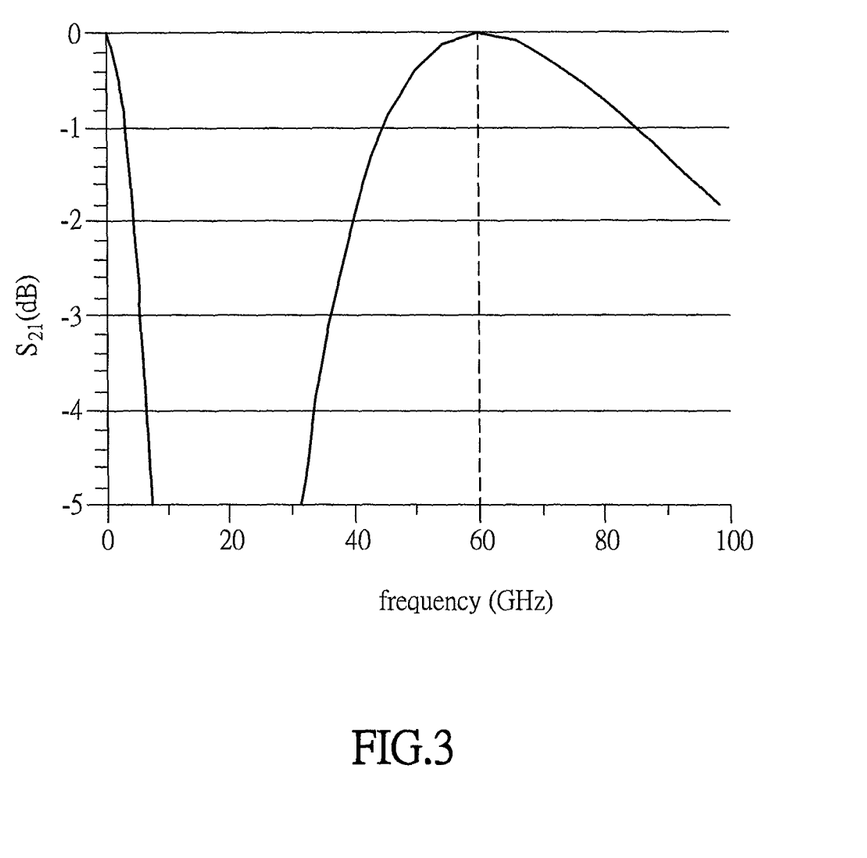
FIG. 3 is a schematic signal diagram of the ESD protection design applied to the high-frequency circuit of 60 GHz.

FIG. 3 is a schematic signal diagram of the ESD protection design applied to the high-frequency circuit 2 (e.g. 60 GHz). As shown in FIG. 3, when the operation frequency (and the resonant frequency $f_0$) of the high-frequency circuit 2 is 60 GHz, the equivalent impedance of the ESD protection circuit 1 is infinity. Therefore, the signal attenuation (S21) of the high-frequency circuit 2 is about 0 dB, which indicates the signal almost won't be attenuated when the operation frequency is 60 GHz.

Figure 4:
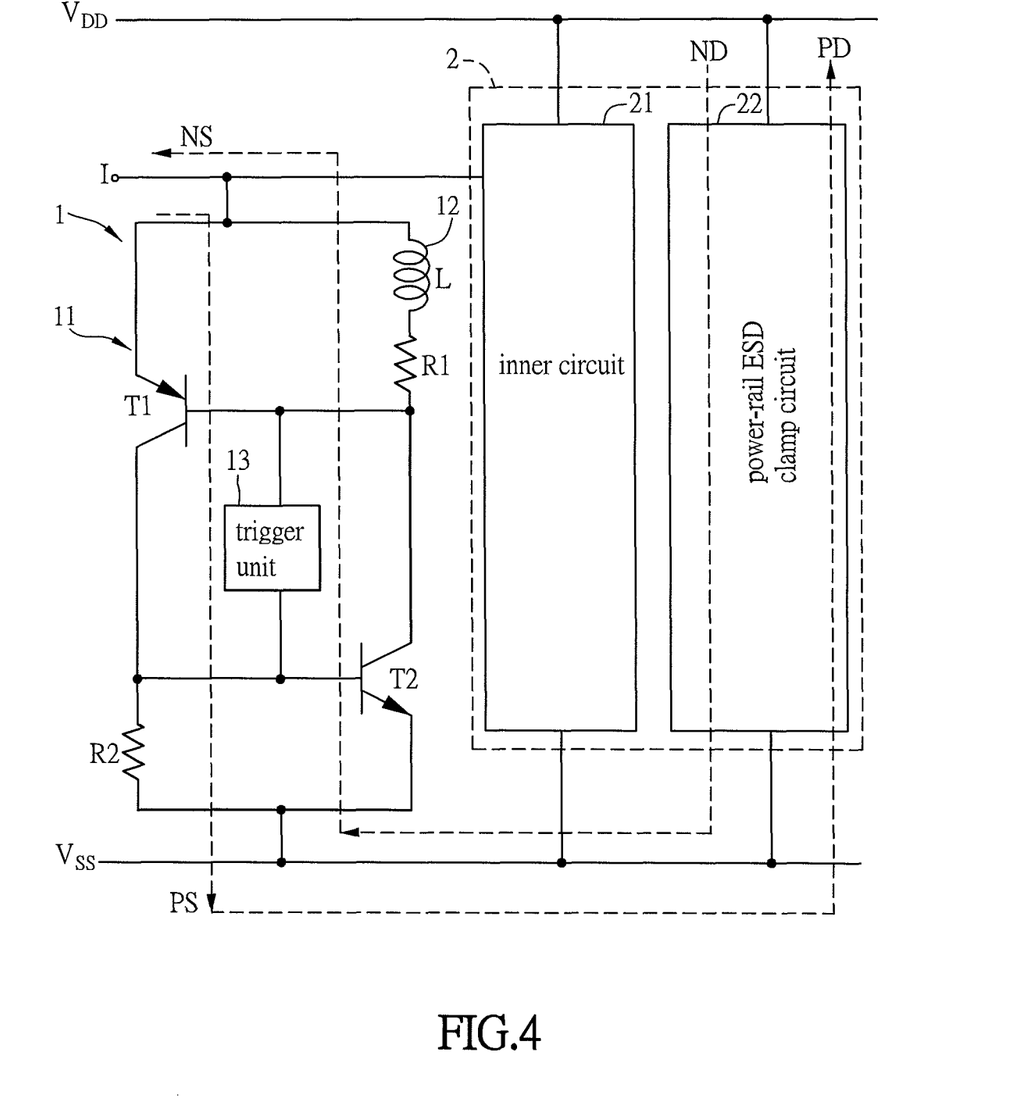
FIG. 4 is a schematic diagram of the turn-on state of the high-frequency circuit and the ESD protection circuit undergoing the electrostatic bombardment.

FIG. 4 is a schematic diagram of the turn-on state of the high-frequency circuit 2 and the ESD protection circuit 1 undergoing the electrostatic bombardment.

When the positive electrostatic voltage discharges electricity to the second voltage $V_{SS}$ through the signal input end I (the current path PS from the positive electrostatic voltage to the second voltage $V_{SS}$), the electrostatic current will flow to the second voltage $V_{SS}$ through the silicon-controlled rectifier element 11. When the positive electrostatic voltage discharges electricity to the first voltage $V_{DD}$ through the signal input end I (the current path PD from the positive electrostatic voltage to the first voltage $V_{DD}$), the electrostatic current will first flow to the second voltage $V_{SS}$ through the silicon-controlled rectifier element 11 and then to the first voltage $V_{DD}$ through the power-rail ESD clamp circuit 22. When the negative electrostatic voltage discharges electricity to the second voltage $V_{SS}$ through the signal input end I (the current path NS from the negative electrostatic voltage to the second voltage $V_{SS}$), the electrostatic current will flow through the parasitic diode of the silicon-controlled rectifier element 11 and the inductive element 12 (the collector to the base of the transistor T1 and the inductive element 12, or the base to collector of the transistor T2 and the inductive element 12). When the negative electrostatic voltage discharges electricity to the first voltage $V_{DD}$ through the signal input end I (the current path ND from the negative electrostatic voltage to the first voltage $V_{DD}$), the electrostatic current will flow through the power-rail ESD clamp circuit 22 and then be discharged through the parasitic diode of the silicon-controlled rectifier element 11 and the inductive element 12. Therefore, the ESD protection circuit 1 can provide many possible ESD paths, and the comprehensive ESD protection can be provided without the connection of external devices.

Figure 5A:
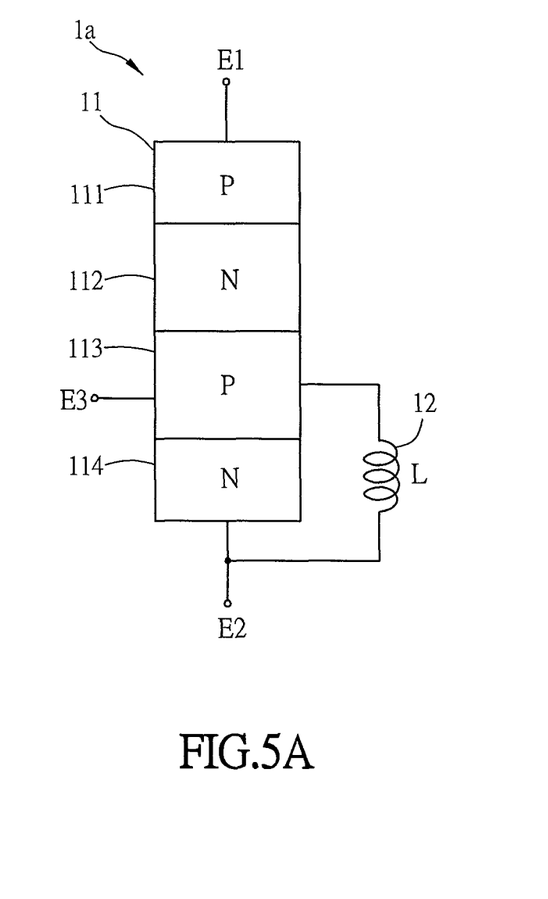
FIG. 5A is a schematic diagram of an ESD protection circuit according to another embodiment of the invention.
Figure 5B:
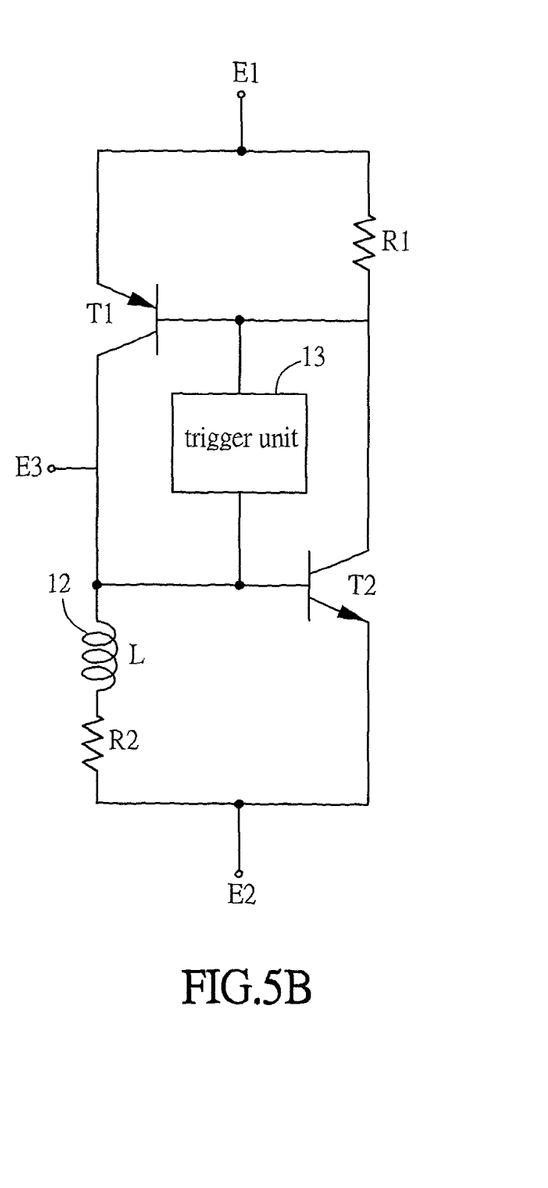
FIG. 5B is a schematic diagram of an equivalent circuit of the ESD protection circuit in FIG. 5A.
Figure 5C:
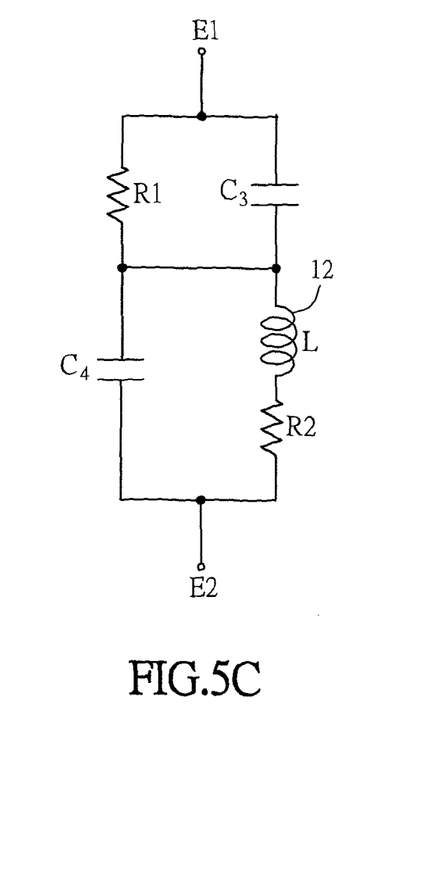
FIG. 5C is a schematic diagram of a simplified equivalent circuit of the circuit of FIG. 5B.

FIG. 5A is a schematic diagram of an ESD protection circuit 1a according to another embodiment of the invention, FIG. 5B is a schematic diagram of an equivalent circuit of the ESD protection circuit 1a in FIG. 5A, and FIG. 5C is a schematic diagram of a simplified equivalent circuit of the circuit of FIG. 5B.

As shown in FIG. 5A, the main difference between the ESD protection circuits 1 and 1a is in that one end of the inductive element 12 of the ESD protection circuit 1a of this embodiment is electrically coupled with the second end E2 of the silicon-controlled rectifier element 11 and the other end thereof is electrically coupled with the second P-type semiconductor material 113. Accordingly, in FIG. 5B, one end of the inductive element 12 is coupled to the base of the transistor T2 and the other end is coupled to the resistance R2. In FIG. 5C, $C_4$ represents the parasitic capacitance between the second P-type semiconductor material 113 and the second N-type semiconductor material 114, i.e. the parasitic capacitance between the base and emitter of the transistor T2, and $C_3$ represents the all parasitic capacitance of the other portion. Besides, $f_0$ represents the resonant frequency of L and $C_4$. Since the equivalent impedance of the parallel connection of $C_4$ and the series connection of L and R2 at the resonant frequency $f_0$ is infinity, the influence of the resistance R1 and parasitic capacitance ($C_3$) of the other portion can be disregarded. In this case, the signal loss of the ESD protection circuit 1a will approach zero.

Since the other technical features of the ESD protection circuit 1a can be comprehended by referring to the same elements of the ESD protection circuit 1, their descriptions are omitted here for conciseness.

Figure 6:
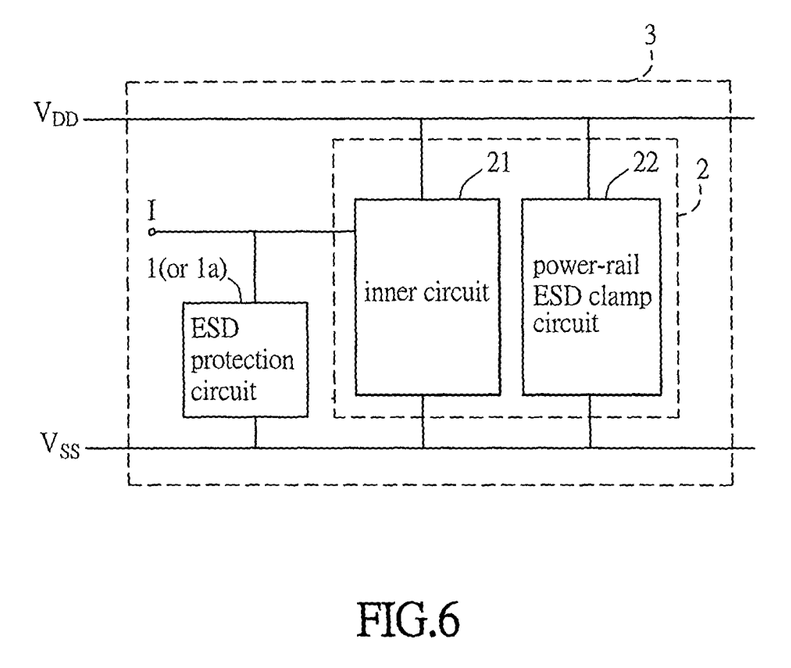
FIG. 6 is a schematic diagram of an integrated circuit according to a preferred embodiment of the invention.

FIG. 6 is a schematic diagram of an integrated circuit 3 according to a preferred embodiment of the invention.

The operation frequency of the integrated circuit 3 can range between several GHz and hundreds of GHz, and includes an ESD protection circuit 1 (or 1a) and a high-frequency circuit 2. The ESD protection circuit 1 (or 1a) is electrically coupled to and between at least a signal input end I or at least a signal output end of the high-frequency circuit 2 and the second voltage $V_{SS}$. The high-frequency circuit 2 is electrically coupled to and between the first voltage $V_{DD}$ and the second voltage $V_{SS}$, and includes the inner circuit 21 and the power-rail ESD clamp circuit 22. The inner circuit 21 is electrically coupled with the power-rail ESD clamp circuit 22 in a parallel connection. The full-chip ESD protection of the integrated circuit 3 can be accomplished by the ESD protection circuit 1 (or 1a) and the power-rail ESD clamp circuit 22.

Since the ESD protection circuit 1 (or 1a) and the high-frequency circuit 2 have been clearly illustrated as above, their descriptions are omitted here for conciseness.

Summarily, in the ESD protection circuit and the integrated circuit of the invention, the ESD protection circuit includes a silicon-controlled rectifier element and an inductive element. The silicon-controlled rectifier element is formed by the sequential connection of a first P-type semiconductor material, a first N-type semiconductor material, a second P-type semiconductor material and a second N-type semiconductor material. One end of the inductive element can be electrically coupled with the first end of the silicon-controlled rectifier element and the other end thereof is electrically coupled with the first N-type semiconductor material, or one end of the inductive element is electrically coupled with the second end of the silicon-controlled rectifier element and the other end thereof is electrically coupled with the second P-type semiconductor material. Thereby, the parasitic capacitance of the silicon-controlled rectifier element can be counteracted by the inductive element, so that the ESD protection circuit of the invention has not only very good ESD protection capability but also very low parasitic capacitance and also won't cause the performance reduction of the integrated circuit.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An ESD protection circuit cooperated with a high-frequency circuit, comprising:
    a silicon-controlled rectifier element formed by the sequential connection of a first P-type semiconductor material, a first N-type semiconductor material, a second P-type semiconductor material and a second N-type semiconductor material, and having a first end electrically coupled with the first P-type semiconductor material and a second end electrically coupled with the second N-type semiconductor material, wherein the first end is an anode of the silicon-controlled rectifier element and the second end is a cathode of the silicon-controlled rectifier element;
    an inductive element, wherein one end of the inductive element is electrically coupled with the first end and the other end of the inductive element is electrically coupled with the first N-type semiconductor material, or one end of the inductive element is electrically coupled with the second end and the other end of the inductive element is electrically coupled with the second P-type semiconductor material; and
    a trigger unit, wherein one end of the trigger unit is electrically coupled to the first N-type semiconductor material and the other end of the trigger unit is electrically coupled to the second P-type semiconductor material.

2. The ESD protection circuit as recited in claim 1, which has a resonant frequency, wherein the high-frequency circuit has an operation frequency and the resonant frequency is equal to the operation frequency.

3. The ESD protection circuit as recited in claim 2, wherein the resonant frequency is equal to $1/2\pi(LC)^{1/2}$, L represents the inductance value of the inductor element, and C represents the parasitic capacitance between the first P-type semiconductor material and the first N-type semiconductor material or between the second P-type semiconductor material and the second N-type semiconductor material.

4. The ESD protection circuit as recited in claim 1, wherein the high-frequency circuit has at least a signal input end or at least a signal output end, and the first end is electrically coupled to the signal input end or the signal output end.

5. An integrated circuit, comprising:
    an inner circuit; and
    an ESD protection circuit electrically coupled with the inner circuit and including a silicon-controlled rectifier element and an inductive element, wherein the silicon-controlled rectifier element is formed by the sequential connection of a first P-type semiconductor material, a first N-type semiconductor material, a second P-type semiconductor material and a second N-type semiconductor material, and has a first end electrically coupled with the first P-type semiconductor material and a second end electrically coupled with the second N-type semiconductor material, the first end is an anode of the silicon-controlled rectifier element and the second end is a cathode of the silicon-controlled rectifier element, and one end of the inductive element is electrically coupled with the first end and the other end of the inductive element is electrically coupled with the first N-type semiconductor material, or one end of the inductive element is electrically coupled with the second end and the other end of the inductive element is electrically coupled with the second P-type semiconductor material, wherein the ESD protection circuit further includes a trigger unit, one end of the trigger unit is electrically coupled to the first N-type semiconductor material and the other end of the trigger unit is electrically coupled to the second P-type semiconductor material.

6. The integrated circuit as recited in claim 5, wherein the ESD protection circuit further has a resonant frequency, the inner circuit has an operation frequency, and the resonant frequency is equal to the operation frequency.

7. The integrated circuit as recited in claim 6, wherein the resonant frequency is equal to $1/2\pi(LC)^{1/2}$, L represents the inductance value of the inductor element, and C represents the parasitic capacitance between the first P-type semiconductor material and the first N-type semiconductor material or between the second P-type semiconductor material and the second N-type semiconductor material.

8. The integrated circuit as recited in claim 5, wherein the inner circuit has at least a signal input end or at least a signal output end, and the first end is electrically coupled to the signal input end or the signal output end.

* * * * *